United States Patent [19]

Hodgson et al.

[11] Patent Number: 4,472,206

[45] Date of Patent: Sep. 18, 1984

[54] METHOD OF ACTIVATING IMPLANTED IMPURITIES IN BROAD AREA COMPOUND SEMICONDUCTORS BY SHORT TIME CONTACT ANNEALING

[75] Inventors: Rodney T. Hodgson; Thomas N. Jackson, both of Ossining; Hans S. Rupprecht, Yorktown Heights; Jerry M. Woodall, Bedford Hills, all of N.Y.

[73] Assignee: International Business Machines Corporation, Armonk, N.Y.

[21] Appl. No.: 440,655

[22] Filed: Nov. 10, 1982

[51] Int. Cl.³ .................................. H01L 21/477
[52] U.S. Cl. .................................. 148/1.5; 148/171; 357/91; 357/61
[58] Field of Search ................. 148/1.5, 171; 357/91, 357/61

[56] References Cited

U.S. PATENT DOCUMENTS

| | | | |
|---|---|---|---|
| 3,969,164 | 7/1976 | Cho et al. | 148/175 |
| 4,135,952 | 1/1979 | Anderson et al. | 148/1.5 |
| 4,174,982 | 11/1979 | Immorlica, Jr. | 148/1.5 |
| 4,226,667 | 10/1980 | Logan | 156/656 |
| 4,312,681 | 1/1982 | Rupprecht et al. | 148/1.5 |

FOREIGN PATENT DOCUMENTS 52-073673 6/1977 Japan .
55-158628 12/1980 Japan .

OTHER PUBLICATIONS

Molnar et al. in Gallium Arsenide and Related Compounds, 1980, Ed. Thim, Inst. Physics, Bristol, 1981, p. 237.
Kuzuhara et al., Appl. Phys. Letts. 41, (1982), 755.
Sealy et al., Thin Solid Films, 26, (1975), L-19.
Davies et al., Inst. Phys. Conf. Ser. #56, Bristol, 1981, p. 229.
Kowalczyk et al., J. Vac. Sci. Technol. 19, (1981), 255.
Device Research Conference, IVA-7, "Surface Layer Impurity Accumulation Due to Evaporation of GaAs During Annealing", by J. Woodall et al.
Appl. Phys. Lett. 38(8), Apr. 15, 1981, pp. 639–641, "Proximate Capless Annealing of GaAs Using a Controlled-Excess As Vapor Pressure Source", by Woodall et al.
Progress in Surface Science, vol. 10, pp. 1–52, "Structure and Reactivity of GaAs Surfaces", by Ranke et al.
Surface Science 77, (1978), L162–L166, "Composition and Structure of Differently Prepared GaAs (100) Surfaces Studied by LEED and AES", by Drathen et al.
Surface Science 43, (1974), 449–461 (particularly p. 451), "Surface Stoichiometry and Structure of GaAs", by Arthur.
Physics of Thin Films, vol. 11, "Progress, Problems, and Applications of Molecular-Beam Epitaxy", by Wood, pp. 48 & 49.

*Primary Examiner*—Upendra Roy
*Attorney, Agent, or Firm*—Alvin J. Riddles

[57] ABSTRACT

Ion implanted impurity activation in a multi-element compound semiconductor crystal such as gallium arsenide, GaAs, over a broad integrated circuit device area, is accomplished using a short time anneal, in the proximity of a uniform concentration of the most volatile element of said crystal, in solid form, over the broad integrated circuit device area surface. A GaAs integrated circuit wafer having ion implanted impurities in the surface for an integrated circuit is annealed in the vicinity of 800°–900° C. for a time of the order of 1–20 seconds in the proximity of a uniform layer of solid arsenic.

11 Claims, 2 Drawing Figures

METHOD OF ACTIVATING IMPLANTED IMPURITIES IN BROAD AREA COMPOUND SEMICONDUCTORS BY SHORT TIME CONTACT ANNEALING

TECHNICAL FIELD

The technical field of the invention is the activation of implanted ion impurities in a multiple element compound semiconductor crystal.

Multiple element compound semiconductor materials have electro-optical and carrier transport properties useful in semiconductor devices, however, the multiple element crystal responds to the effects of such processing operations as heating in ways that not only affect the location of impurities but also the stoichiometry of the crystal. Where the crystal surface undergoing processing is a relatively broad area, such as is the case where an integrated circuit is being produced, the conditions must be uniform over the entire surface area in order to assure a yield of uniform devices.

One technique of introducing semiconductor property imparting impurities into such crystals is known as ion implantation. This technique has the advantages of precision positioning, and low, in the vicinity of room temperature, processing; but the technique also requires a subsequent annealing step at high temperatures which is necessary to repair crystal damage and to activate the implanted impurities. With large scale integration of circuits, the surface area becomes larger and ion implantation activation annealing results in nonuniformity, the major reason being localized loss of the ingredients of the multiple element compound semiconductor material.

BACKGROUND ART

There have been some efforts in the art to control the problem of uniformity over a multiple element compound semiconductor surface when an ion implantation annealing step is employed.

The tendency of the multiple element compound semiconductor GaAs to decompose during processing has received some attention in the art. There have been two general techniques employed. The first is by applying a capping layer, such as $SiO_2$, which prevents decomposition. This first technique is shown in U.S. Pat. No. 4,226,667.

The second technique involves the use of a native oxide of the GaAs and this technique is illustrated in U.S. Pat. No. 3,969,164.

The art has principally been directed to a control of surface stoichiometry. In U.S. Pat. No. 4,135,952 an effort is made to keep GaAs from decomposing during ion implantation annealing by placing the GaAs crystal surface in proximity with a GaAs crystal in a Ga solution. The desirability of having an excess of the more volatile element of the GaAs is shown in U.S. Pat. No. 4,312,681 wherein InAs is used as a source of excess arsenic to prevent decomposition. Each of these require a standard long, about 30 minute, annealing step.

In Appl. Phys. Lett. 38, 8 15 Apr. 1981, p. 639, detrimental effects of diffusion of certain substrate impurities in the material GaAs during long annealing steps is recognized and high excess As pressure from InAs is employed for control.

In Device Research Conference IVA-7-June 26–28, 1982, selective evaporation of GaAs during a conventional long ion implantation annealing step and diffusion of Mn from substrate are reported as problems.

DISCLOSURE OF THE INVENTION

Uniform ion implantation activation over a broad area of multiple element compound semiconductor crystal surface is accomplished in accordance with the invention by providing a uniform, controlled, specific quantity of the most volatile element of the multiple element compound semiconductor in solid form in contact with the entire future integrated circuit surface of the crystal. The solid most volatile element becomes a uniform controlled gas source during the annealing step used to activate the ion implanted impurities permitting a short, of the order of a few seconds, conventional temperature, annealing step.

The invention prevents decomposition and enhances proper dopant site selection during the annealing and permits a radically shortened annealing cycle.

In the prior art, for long time annealing steps of the order of 30 minutes using non-proximate conditions to suppress decomposition, out diffusion of certain impurities from the substrate operates to limit the uniformity of electrical activation of the implanted dopant. For proximate contact conditions in suppressing decomposition, non-uniformity of implant activation due to the diffusion of the most volatile element to and from the edge and center of the future circuit area operates to limit the useful size of that area.

In many conditions of processing, the future circuit area is the surface of a semiconductor wafer.

In order to facilitate explanation of the invention, the description will be focused on the particular multiple element compound semiconductor material gallium arsenide (GaAs) although it will be apparent to one skilled in the art in the light of the principles set forth that those principles can be readily translated to the other multiple element compound semiconductor materials, such as InP and GaAlAs.

In accordance with the invention, the specific quantity of solid As in contact uniformly all over the surface of the future circuit area when vaporized during the anneal cycle prevents As and Ga erosion, inhibits As concentration changes by diffusion, permits a radically shorter annealing cycle time, and provides excess As vapor pressure to drive group IV implanted dopants onto donor sites.

Figure 1:
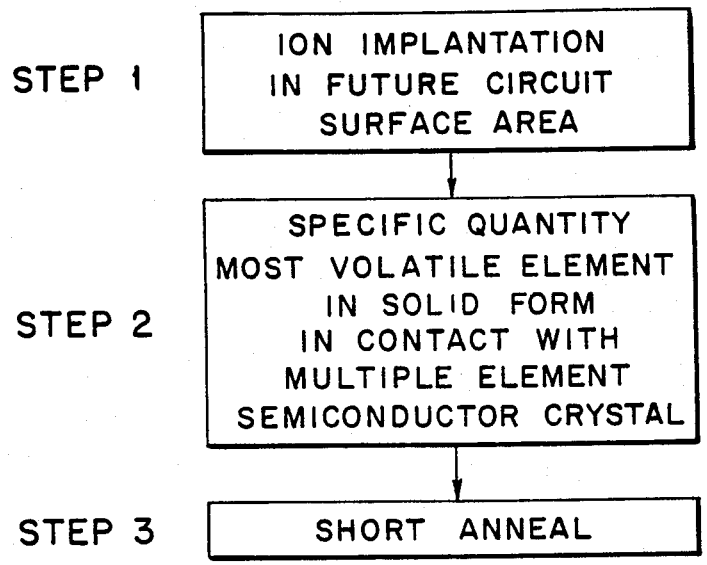
FIG. 1 is a flow chart illustrating steps in performing the invention.

Referring to FIG. 1, a flow chart is provided wherein in step 1 a multiple element compound semiconductor crystal substrate is implanted with semiconductor conductivity determining ions in the portion of the crystal that is to be the area of the future integrated circuit. The depth and extent of implantation will vary with the properties being imparted. In step 2 the substrate is positioned with the future device area in contact with a uniform controlled source of solid phase of the most volatile element of the multielement compound semiconductor. This operates to provide a uniform yet controlled quantity of excess of the most volatile element over the entire surface of the substrate which when vaporized in a subsequent annealing step permits a radically shortened annealing step. An improvement can be provided by forming a recess in the source backing so that the edges of the backing contact the device area surface and confine the volatile element vapor in a limited controlled volume.

Figure 2:
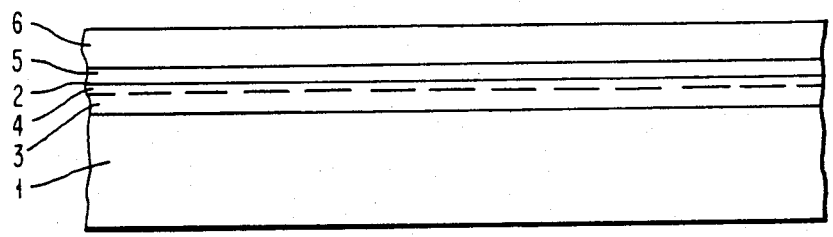
FIG. 2 is a schematic illustration of a layer of solid arsenic in contact with the GaAs surface during annealing.

In the third step, the short time, conventional temperature, annealing step takes place. The extent of the annealing step will be relative to the depth and extent of the implantation but through the benefits of the invention a significantly reduced time is achieved.

Where the material is GaAs, the specific quantity, solid arsenic source in contact with the substrate can be achieved as illustrated in FIG. 2. A GaAs substrate 1 has a surface area 2 in which the integrated circuit is to be placed. In practice, the substrate 1 may be equipped with an epitaxial device layer 3 of, for example, GaAs or GaAlAs epitaxially grown thereon. Within the region 4 adjacent to the surface 2 semiconductor conductivity determining impurities are ion implanted.

It will be understood by one skilled in the art that the structure of FIG. 2 is schematic in that the portion shown is only a two-dimensional section as an example integrated circuit area and that the implanted region 4 may be a layer or a pattern.

In contact with the surface 2, in accordance with the invention, the specific quantity solid arsenic source is positioned. The arsenic is shown as a layer 5 having a backing material 6. The presence of the excess As prevents the formation of oxides of Ga which are difficult to remove. The uniformity of controlled quantity of As inhibits non-uniform lateral As diffusion. The short temperature cycle reduces out diffusion and/or redistribution of certain substrate impurities.

Best Mode For Carrying Out The Invention

Silicon ions are introduced by ion bombardment into a crystalline GaAs device wafer at energies of 50 to 200 kiloelectron volts (KEV) at fluences of $10^{12}$ to $10^{14}$ ions per square centimeter and depth of 100 Å to 2000 Å. The ion bombarded surface is then placed in contact with a backing wafer of GaAs having a layer of arsenic of the order of 10 Å to 500 Å thick. Annealing takes place for 1 to 20 seconds at temperatures between 800° C. and 900° C.

A preferred arrangement for providing the solid As source on a wafer of GaAs is the photoetch technique described in copending application Ser. No. 440,654 filed Nov. 10, 1982.

It will be apparent to one skilled in the art that the future circuit area surface may also be coated with the solid most volatile element prior to the implanting step. This has the beneficial effect of introducing some of the most volatile element into the implanted region adjacent the surface during the implantation step thereby increasing the concentration. A backing not requiring the most volatile element is then placed in contact with the surface during annealing.

In summary, what has been provided is a technique of controlling the surface of a multiple element compound semiconductor such as GaAs during processing to permit uniform ion implantation activation wherein a controlled source of the most volatile element such as As for GaAs in solid form is uniformly in contact with the surface which when volatilized on annealing provides a uniform concentration maintained over the surface.

Having thus described our invention, what we claim as new and desire to secure by Letters Patent is:

1. In the formation of an array of semiconductor devices involving regions of specific semiconductor properties imparted by activated implanted ions in a surfaces area of an annealed ion implanted multielement compound semiconductor crystal the improvement for uniform activation of said implanted ions over said surface area comprising maintaining a specific quantity of the most volatile element of said multielement compound in solid evenly distributed over and in contact with said surface area, while, heating and then cooling said crystal in a short time cycle.

2. The improvement of claim 1 wherein said heating is in the 800° to 900° C. range and said time cycle is a period of from 1 to 20 seconds.

3. The improvement of claim 2 wherein said crystal is GaAs and said specific quantity of said most volatile element is a layer of arsenic on a GaAs wafer backing.

4. The process of broad area uniform ion implantation activation in a multielement compound semiconductor crystal comprising the steps of:

ion implanting semiconductor conductivity determining impurities into said crystal through a device area surface, providing a specific quantity of the most volatile element of said multielement compound in solid form uniformly distributed over and in contact with said surface, while applying a short annealing temperature cycle.

5. The process of claim 4 wherein said semiconductor is a member of the group of GaAs, InP and GaAlAs.

6. The process of claim 5 wherein said semiconductor is GaAs and said specific quantity of the most volatile element is a layer of As with a GaAs wafer backing.

7. The process of claim 6 wherein said implanted impurities are Si Ions implanted to a depth of 100 Å to 2000 Å and said annealing cycle is 800° to 900° C. for 1 to 20 seconds.

8. The process of broad area uniform ion implantation activation in a multielement compound semiconductor crystal comprising the steps of:

implanting semiconductor conductivity determining impurities through a device area surface of said crystal, placing a layer of the most volatile element of said crystal in contact with said surface of said crystal, annealing during a short temperature cycle the combination of said layer and said crystal, while confining the vaporization product of said layer to said surface.

9. The process of claim 8 wherein said implantation step is performed through said layer.

10. The process of claim 8 wherein said crystal as GaAs and said layer is As confined by a GaAs backing.

11. The process of claim 9 wherein said crystal is GaAs confined by a GaAs backing.

* * * * *